United States Patent
Chen et al.

(10) Patent No.: US 8,754,446 B2
(45) Date of Patent: Jun. 17, 2014

(54) SEMICONDUCTOR STRUCTURE HAVING UNDERCUT-GATE-OXIDE GATE STACK ENCLOSED BY PROTECTIVE BARRIER MATERIAL

(75) Inventors: Xiaomeng Chen, Poughkeepsie, NY (US); Shwu-Jen Jeng, Wappingers Falls, NY (US); Byeong Y. Kim, Lagrangeville, NY (US); Hasan M. Nayfeh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 894 days.

(21) Appl. No.: 11/468,403

(22) Filed: Aug. 30, 2006

(65) Prior Publication Data
US 2008/0121931 A1    May 29, 2008

(51) Int. Cl.
*H01L 29/772* (2006.01)

(52) U.S. Cl.
USPC .......................................... 257/192; 438/439

(58) Field of Classification Search
USPC .................. 438/197; 257/E51.005, E27.099, 257/E29.26, 900
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |

(Continued)

FOREIGN PATENT DOCUMENTS

JP          64-76755        3/1989

OTHER PUBLICATIONS

Kern Rim, et al., "Transconductance Enhancement in Deep Submicron Strained-Si n-MOSFETs". International Electron Devices Meeting, 26, 8, 1, IEEE, Sep. 1998.

(Continued)

*Primary Examiner* — Walter H Swanson
(74) *Attorney, Agent, or Firm* — Joseph Abate; Roberts Mlotkowski Safran & Cole, P.C.

(57) ABSTRACT

The invention is directed to a structure and method of forming a structure having a sealed gate oxide layer. The structure includes a gate oxide layer formed on a substrate and a gate formed on the gate oxide layer. The structure further includes a material abutting walls of the gate and formed within an undercut underneath the gate to protect regions of the gate oxide layer exposed by the undercut. Source and drain regions are isolated from the gate by the material.

11 Claims, 6 Drawing Sheets

(56) References Cited

U.S. PATENT DOCUMENTS

| | | | |
|---|---|---|---|
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,514,808 B1* | 2/2003 | Samavedam et al. | 438/197 |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0113174 A1 | 6/2004 | Chidambarrao et al. | |
| 2004/0113217 A1 | 6/2004 | Chidambarrao et al. | |
| 2004/0132236 A1* | 7/2004 | Doris et al. | 438/182 |
| 2004/0238914 A1 | 12/2004 | Deshpande et al. | |
| 2004/0262784 A1 | 12/2004 | Doris et al. | |
| 2005/0029601 A1* | 2/2005 | Chen et al. | 257/369 |
| 2005/0040460 A1 | 2/2005 | Chidambarrao et al. | |
| 2005/0082634 A1 | 4/2005 | Doris et al. | |
| 2005/0087824 A1* | 4/2005 | Cabral et al. | 257/412 |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2006/0292754 A1* | 12/2006 | Min et al. | 438/131 |
| 2007/0126067 A1* | 6/2007 | Hattendorf et al. | 257/412 |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 235.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechaninal-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang,et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et at., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Shatz, et at, "Degradation and Recovery of SiGe HBTs Following Radiation and Hot-Carrier Stressing." pp. 14-15.

Z. Yang, et al., "Avalanche Current-Induced Hot Carrier Degradation in 200 GHz SiGe Heterojunction Bipolar Transistors." pp. 1-5.

H Li, et al., "Design of W-Band VCOs with High Output Power for Potential Application in 77 GHz Automotive Radar Systems." 2003 IEEE GaAs Digest pp. 263-266.

K Wurzer, et al., "Annealing of Degraded npn-Transistors- Mechanisms and Modeling." IEEE Transactions on Electron Devices, vol. 41, No. 4, Apr. 1994, pp. S33-S38.

B. Doyle et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

(56) References Cited

OTHER PUBLICATIONS

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys", IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for $SI_{1-x}GE_x$ Strained Layers on (100) Si". Appl. Phys. Lett. 56 (5), Jan. 29, 1990, pp. 460-462.

Q. Ouyang et al., "Two-Dimensional Bandgap Engineering in a Novel Si/SiGe pMOSFET with Enhanced Device Performance and Scalability". 2000 IEEE, pp. 151-154.

\* cited by examiner

SEMICONDUCTOR STRUCTURE HAVING UNDERCUT-GATE-OXIDE GATE STACK ENCLOSED BY PROTECTIVE BARRIER MATERIAL

FIELD OF THE INVENTION

The invention relates to a semiconductor structure and method of manufacture and, more particularly, to a structure having a sealed gate oxide layer and method of manufacture.

BACKGROUND OF THE INVENTION

A MOSFET device, amongst other features, has a metal oxide capacitor, consisting of a gate and gate oxide layer. In such a device, the gate oxide material is layered underneath the gate spanning between the source and the drain region of the device. The dielectric constant k of the gate oxide material and the thickness d of the gate oxide layer determine the capacitance and field homogeneity and thus the device performance. Damage to the gate oxide layer during the manufacturing process may result in either device failure or at minimum, in an undesired reduction of device performance. Therefore, in order to achieve satisfactory device performance, the gate oxide layer should remain intact during manufacture of the semiconductor device.

In conventional processes, a MOSFET precursor comprises a substrate, e.g., a silicon-on-insulator (SOI) region. A layer of gate oxide is deposited onto the entire wafer surface. In a subsequent step, a polysilicon gate is fabricated, in conventional manners, at a desired location over the gate oxide layer. At this stage and prior to etching the source and drain region, the polysilicon gate is protected by silicon nitride at its sidewalls and top surface, e.g., a nitride sidewall and cap, respectively. The nitride sidewall and cap layers are typically very thick, in the ranges of upwards of 20 nm. Once the nitride sidewall and cap layers are formed, the source and drain regions are etched by anisotropic methods such as reactive ion etching (RIE). This results in the structure comprising a polysilicon gate with the thick nitride sidewall and cap layer, and the underlying gate oxide layer that is laterally exposed to the source and drain wells.

Prior to filling the source and drain wells with epitaxial material, the wells undergo an isotropic cleaning to remove any native oxide material that was generated during the previous steps, e.g., etching of the wells. During this so-called EPI pre-clean step, the oxide material is treated with hydrogen fluoride or similar reagents to generate volatile reaction products. After removal of the volatile products, the surface of the source and drain region comprises pure silicon which serves as basis for growth of the epitaxial material of the source and drain region.

However, the isotropic EPI pre-clean step also etches away unprotected areas of the gate oxide layer. That is, during the EPI pre-clean, the gate oxide layer is subject to the removal reagents which removes portions of the gate oxide layer, resulting in an undercut of up to 5 nm or more under the gate. This effectively shortens the length of the gate oxide layer and exposes portions of the gate. Prior to removing the nitride sidewall, the wells are filled to form the source and drain region. The material, which is used to fill the source and drain, will also fill the undercut region and hence come into direct contact with the gate.

Thus, if the gate oxide is undercut too much, the material for filling the source and drain region will come into contact with the gate, itself. This will result in failure of the device. Accordingly, to avoid device failure, in conventional device manufacture, the protective sidewalls are 10 nm or thicker to ensure that the undercut, during the cleaning process, does not corrode the gate oxide to such an extent that the gate becomes exposed in the undercut. However, due to the thickness of the sidewalls, i.e., 10 nm or greater, the conventional device has a source well to drain well distance greater than the actual gate length, thus ensuring that there will be no shorting but also negatively affecting device performance.

SUMMARY OF THE INVENTION

In a first aspect, the present invention is directed to a structure comprising a gate oxide layer formed on a substrate and a gate formed on the gate oxide layer. The structure further includes a material abutting walls of the gate and formed within an undercut underneath the gate to protect regions of the gate oxide layer exposed by the undercut. Source and drain regions are isolated from the gate by the material.

In another aspect, the invention is directed towards a method for manufacturing a device. The method comprises forming a layer on a substrate and forming a gate on the layer. An undercut is formed under the gate by removing portions of the layer. A barrier layer is formed within the undercut to protect the layer from corrosion during subsequent processing steps. Source and drain regions are also processed.

In a further aspect, the method includes forming a gate on a substrate. The gate includes a gate oxide layer formed between the substrate and the gate. The method further includes etching portions of the gate oxide layer to form an undercut under the gate. The exposed portions of the gate oxide layer are protected while forming sidewalls abutting the gate. The source and drain wells are formed into the substrate adjacent the gate and filled with conductive material.

DETAILED DESCRIPTION OF THE EMBODIMENTS OF THE INVENTION

Figure 1:
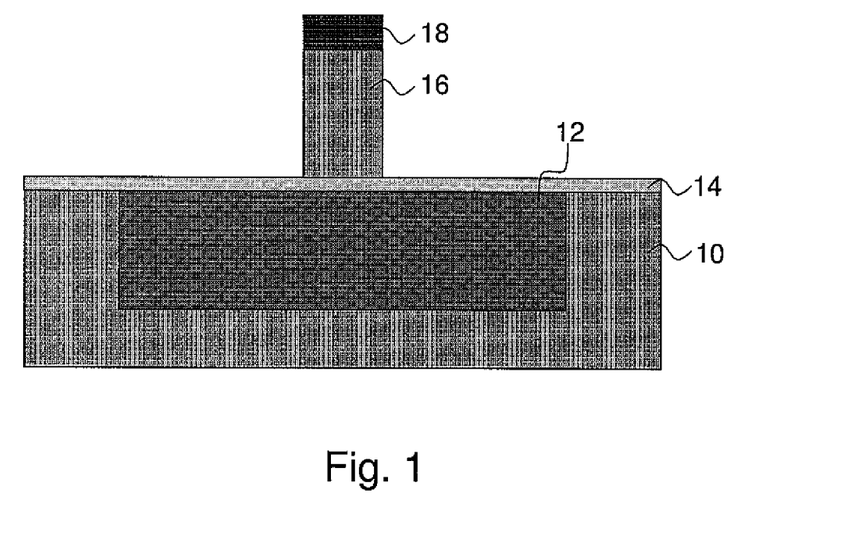
FIGS. 1-5 show manufacturing processes in accordance with the invention.

FIG. 1 shows a beginning structure in accordance with the invention. In this beginning structure, a SOI 12 is embedded in a substrate 10. The substrate may be BOX. A gate oxide layer 14, for example, is blanket grown onto the SOI 12 and optionally on the substrate 10 using any conventional method such as, for example, without limiting the scope of the invention, thermally grown oxide with nitrogen enrichment or chemical vapor deposition processes. These chemical vapor deposition processes may include low-pressure chemical vapor deposition (LPCVD) or, if the desired gate oxide necessitates, metal organic CVD (MOCVD).

The gate oxide layer 14 can comprise any appropriate metal oxide material. The gate oxide layer 14 is, in embodiments, determined by the desired capacitance of the gate using a high dielectric constant (k) material with low dielectric leakage current, for example. In embodiments, the gate oxide layer may be exchanged with a nitride layer or other appropriate material such as, for example, silicon oxide. In further embodiments, the gate layer 14 can comprise a thickness between approximately 0.5 nm to 3 nm. However, the thickness of the gate oxide layer 14 may vary depending on any number of known parameters such as the gate oxide material, itself. Therefore, in view of the various factors for generating a desired capacitance, thickness outside the above-described region are equally contemplated by the invention.

Still referring to FIG. 1, a gate 16 is formed at any desired location on the gate oxide layer 14 above the SOI region 12. The gate 16 can comprise any appropriate material. In embodiments, the gate 16 is made of polysilicon; however, based on device performance and the gate oxide material, the gate material can be of any material necessary to warrant the desired performance. For example, if a gate oxide material has a dielectric constant higher than the dielectric constant of silicon dioxide (high-k material), then a gate can be made of more compatible material including metals. The gate 16 is capped by a protective barrier layer 18 which can be made of any material used for protecting parts of a semiconductor device such as, for example, nitride material.

Figure 2:
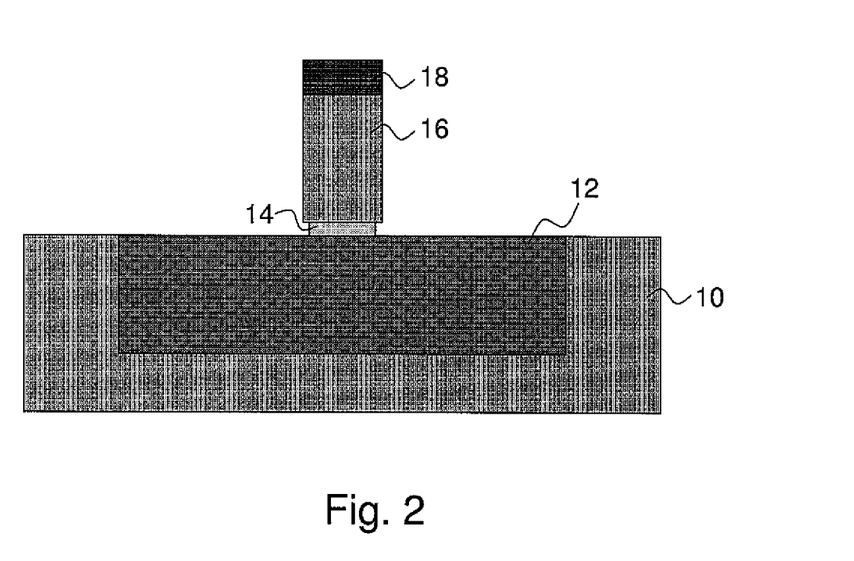

FIG. 2 shows further process steps in accordance with the invention. As shown in FIG. 2, excess material from the gate oxide layer 14, not covered by the gate 16, is removed during this processing step. During this stage of processing, an undercut is formed under the gate 16. Any conventional method can be used to remove portions of the gate oxide layer 14 including isotropic and anisotropic methods or any dry or wet methods. In embodiments, the removal process is chosen based on the type and thickness of the gate oxide. In embodiments, for example, if the gate oxide is silicon oxide, the removal process can include using hydrogen fluoride in any form, such as gas, liquid, solution, in mixture with other agents, buffered, diluted or anhydrous.

In embodiments, an isotropic etching leads to lateral removal of material underneath the gate 16 causing an undercut. Such undercut underneath the gate 16 can reach dimensions of up to 5 nm per side.

Figure 3:
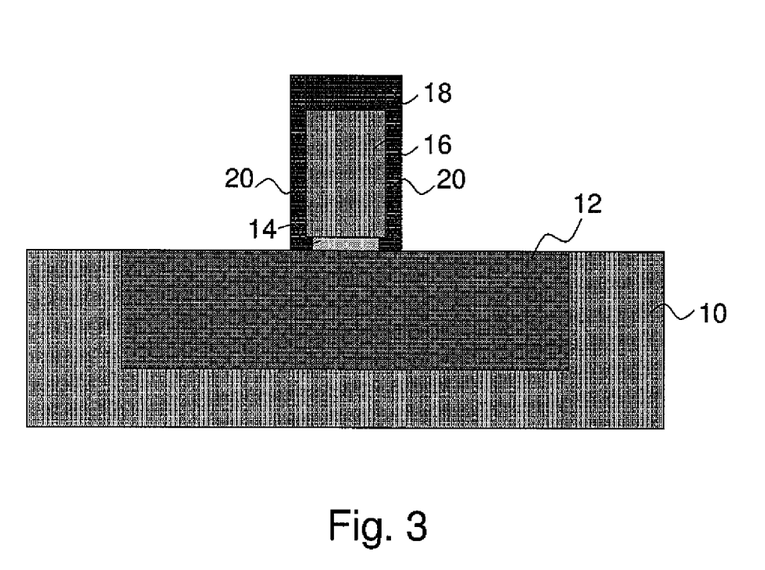

FIG. 3 shows further process steps in accordance with the invention. In this processing step, a protective barrier material such as nitride is formed on the sidewalls of the gate 16 to form a protective layer 20. The protective barrier material also covers exposed portions of the gate oxide layer 14 in the undercut underneath the gate 16. The protective layer 20 can be formed in any conventional manner, known to those of skill in the art such as, for example, nitride deposition processes such as plasma enhanced chemical vapor deposition (PECVD) or rapid thermal chemical vapor deposition (RTCVD).

As shown in FIG. 3, the gate stack is completely enclosed by the protective barrier layers 18 and 20, in addition to the SOI material 12. In this manner, the sealed structure is now protected from any further processing steps, as described in greater detail below. Thus, during subsequent cleaning steps, the gate oxide layer will not be exposed to etchant chemistries, thus ensuring that the gate oxide layer will remain intact. This, in turn, ensures that the gate, itself, will not become exposed during subsequent steps, thus preventing short circuits in the device.

In embodiments, the sidewalls which are formed from the protective layer 20 do not require added thickness to avoid undercut erosion of the gate oxide 12 in subsequent processing steps. This is due to the fact that the protective barrier 20 is provided within the undercut, as compared to conventional methods which do not have any protective material within the undercut. Thus, in the case of this embodiment, the sidewalls formed from the protective layer 20 can be 10 nm or less in thickness and, even with this thickness, under gate erosion can be avoided. This will prevent shorts from occurring in subsequent processing steps.

Also, it is important to note that since the gate stack is now completely enclosed, no additional material, e.g., precautionary thickness for the sidewalls, is necessary to prevent gate oxide corrosion and gate undercut. Thus, the thickness of the sidewalls can be reduced to the minimum necessary for protecting the gate stack from exposure to any subsequent process steps. This in turn, also reduces the distance between the gate oxide and the source and drain regions.

Figure 4:
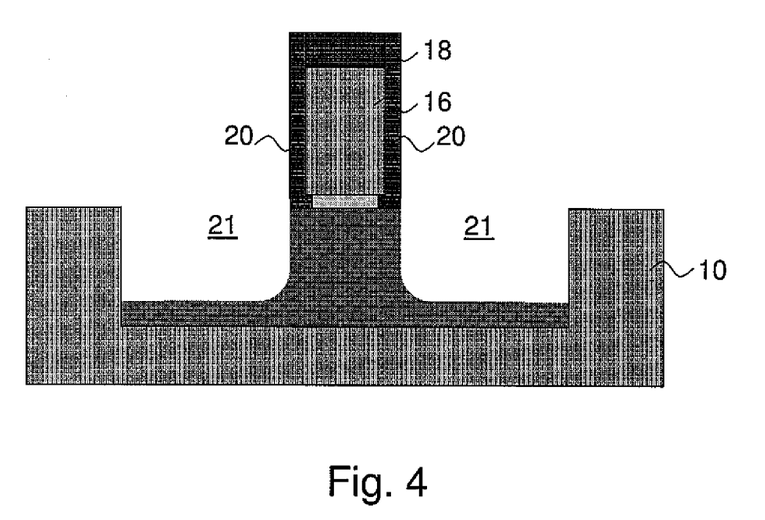

FIG. 4 shows additional process steps in accordance with the invention. In these processing steps, etching is performed to form the source and drain (S/D) wells 21. The formation of the source and drain wells 21 can be accomplished using anisotropic etching such as RIE. As is shown in FIG. 4, there is a difference between the gate length (well to well distance) and the transistor length (length of gate oxide in contact with SOI). This difference is approximately two times the sidewall thickness of the protective layer 20 at the level of the gate oxide 12. However, this distance is significantly decreased, compared to conventional structures and methods, since the protective layer 20 is 10 nm or less at the sidewalls, owing to the manufacturing processes described herein. Thus, applying the present method, the length of the gate oxide can be increased by approximately 0.2 nm or more by selecting an appropriate sidewall 20 thickness. In this manner, transistor efficiency is substantially increased over that of the known art.

Figure 5:
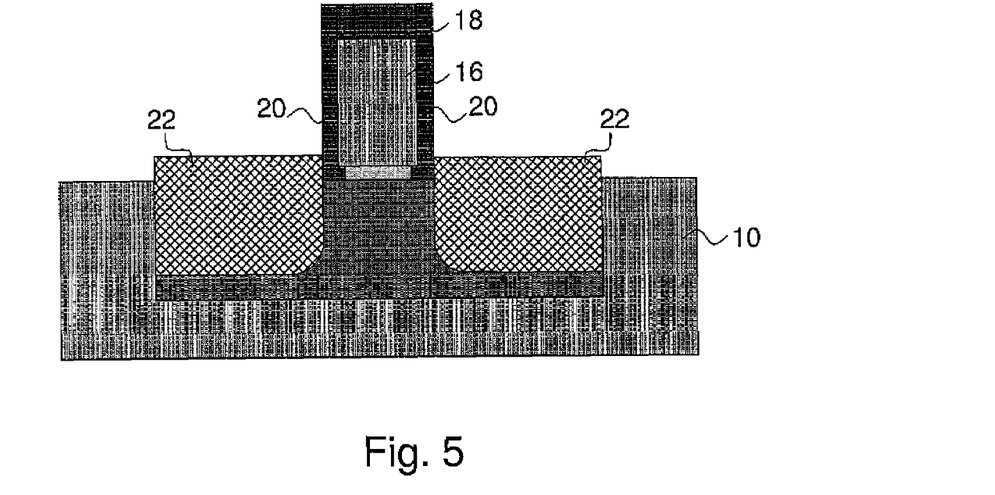

FIG. 5 shows further process steps in accordance with the invention. In FIG. 5, the source and drain wells 21 are filled with epitaxial material 22. In embodiments, the source and drain wells 21 are filled with SiGe that is epitaxially grown. By filling the source and drain wells 21 with SiGe, the device may be placed in a compressive strain which is preferred for a PFET device. Although this embodiment exemplifies the aspects of the invention with use of a PFET device, it is obvious that the same method can be used during the manufacture of a NFET device or both, e.g., CMOS devices. In embodiments, the SiGe composition can be of various different ratios, e.g., the atomic Ge content can be between 0.1 and 50 atomic %, preferably between 1 and 40 atomic %, and more preferably between 5 and 30 atomic %.

Figure 6:
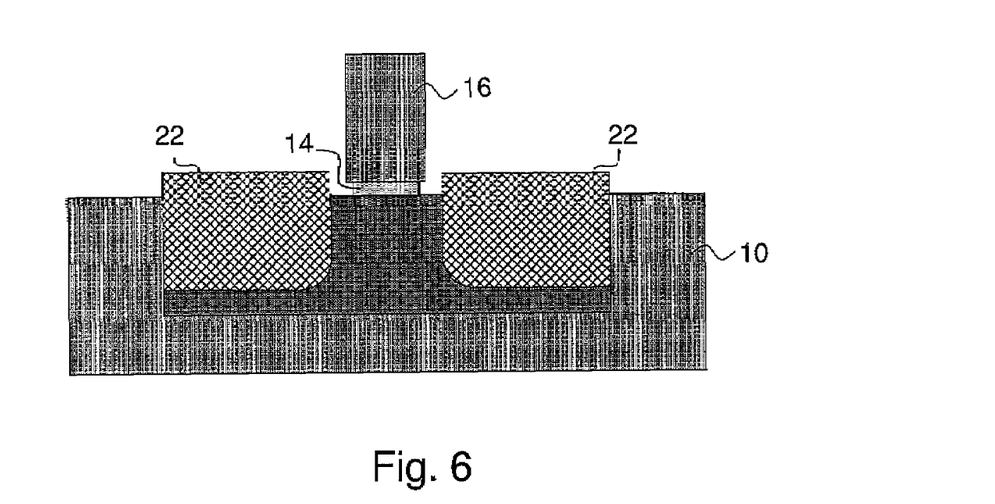
FIG. 6 shows a final processing step in accordance with the invention, in addition to a final structure.

FIG. 6 shows another processing step of the invention, in addition to a final structure. In the processing step of FIG. 6, the protective layer 20 is removed using any conventional method known to those of skill in the art. As shown, using the processes described herein, and more particularly, the protective layer 20, the gate 16 and gate oxide layer 14 remain separated from the source and drain material thus preventing any shorts from occurring in the device.

It is noted that the device performance increases using the fabrication method of the invention. For example, shorting of the device is prevented. In addition, the eSiGe grown source/drain edge can be closer to the transistor channel, improving transistor performance.

Figure 7:
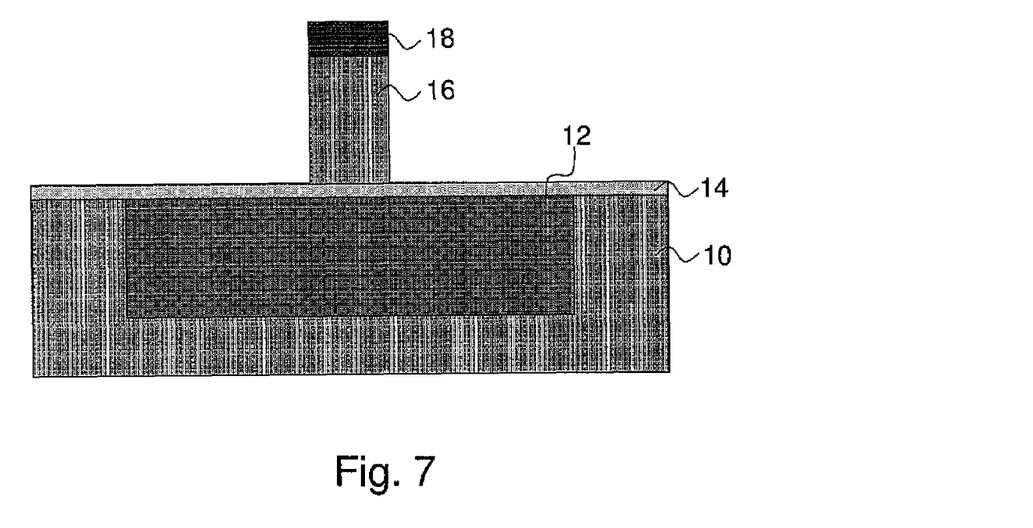
FIGS. 7-11 show alternative manufacturing processes in accordance with the invention.
Figure 8:
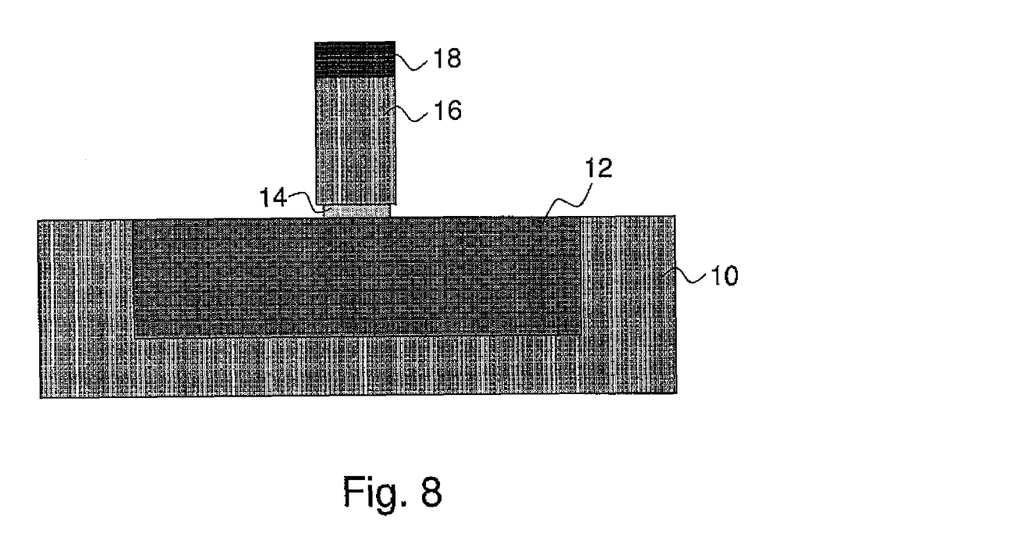
Figure 9:
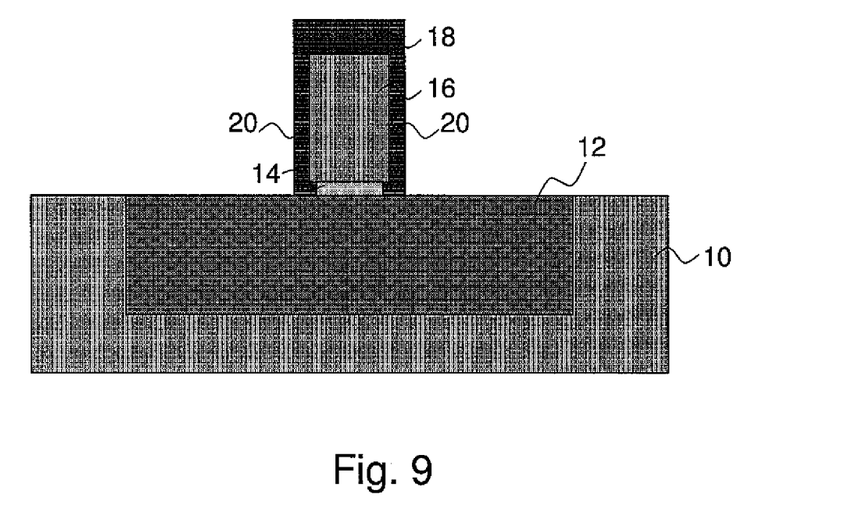

FIGS. 7-12 show an alternative method of fabricating a structure in accordance with the invention. FIGS. 7-9 show the same processing steps as described with reference to FIGS. 1-3. By way of example, FIG. 7 shows a beginning structure in accordance with the invention. In this beginning structure, a SOI 12 is embedded in a substrate 10. A gate oxide layer 14 is blanket grown onto the SOI 12 and optionally on the substrate 10 using any conventional method as described above. The gate oxide material can comprise any appropriate metal oxide material including silicon oxide and can comprise a thickness between approximately 0.1 nm and 7 nm.

Still referring to FIG. 7, a gate 16 is formed at any desired location on the gate oxide layer 14 above the SOI region 12. The gate 16 can comprise any appropriate material such as of polysilicon. However, based on device performance and the desired gate oxide material, the gate material can be of any appropriately known material to warrant the desired performance, as describe with reference to FIG. 1.

As shown in FIG. 8, excess gate oxide material 14, not covered by the gate 16, is removed using any conventional processing. In embodiments, an isotropic method leads to lateral removal of material underneath the gate 16 resulting in an undercut under the gate 16. Such undercut underneath the gate 16 can reach dimensions of up to 5 nm per side.

FIG. 9 shows further process steps in accordance with the invention. In these processing steps, a protective layer 20 is formed on the sidewalls of the gate 16. As with FIG. 3, the protective layer 20 also covers exposed portions of the gate oxide layer 14 in the undercut underneath the gate 16. The gate stack is now completely enclosed by the protective barrier material layers 18 and 20, in addition to the SOI 12. In this manner, the sealed structure is now protected from any further processing steps. The protective layer 20 can be formed in any conventional manner, known to those of skill in the art.

As in the previous embodiment described above, the sidewalls formed from the protective layer 20 do not require added thickness to avoid undercut erosion in subsequent processing steps. This is due to the protective layer 20 being provided within the undercut thus protecting the oxide layer from any corrosion. In the case of this embodiment, the thickness of the sidewalls formed from the protective layer 20 can be significantly minimized to about 10 nm or less in thickness and, again, gate erosion can be avoided. This will prevent shorts from occurring in subsequent processing steps.

Thus, as with the previous embodiment, since the gate stack is now completely enclosed, no additional material, e.g., precautionary thickness for the sidewalls, is necessary to prevent gate oxide corrosion and gate undercut. Thus, the thickness of the sidewalls can be reduced to the minimum necessary for protecting the gate stack from exposure to any subsequent process steps.

Figure 10:
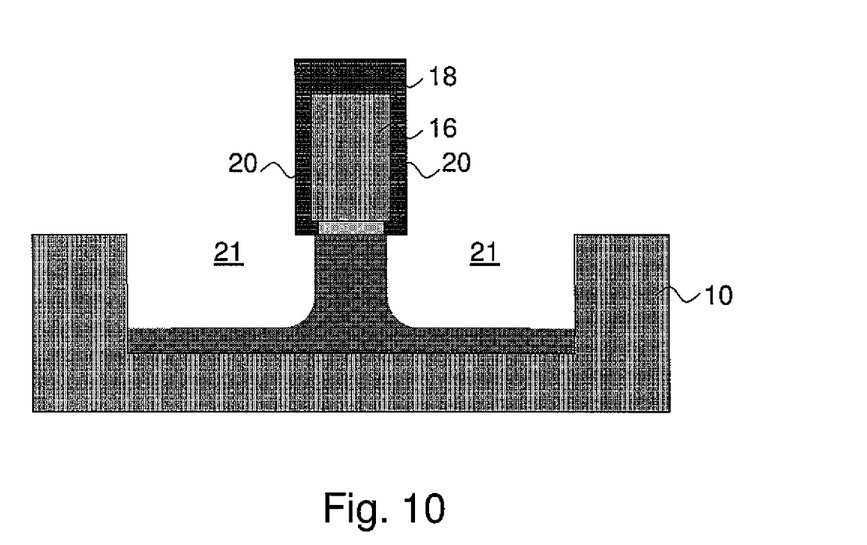

FIG. 10 shows alternative processing steps in accordance with the invention. An isotropic etching process is used to form the source and drain wells 21. As is shown in FIG. 10, although the isotropic etching causes an undercut under the gate 16, the protective layer 20 remains intact, protecting the gate oxide layer 14 from being eroded. This will prevent any future shorting of the device. More specifically, this will prevent the corrosion of the oxide layer 14 from reaching beyond the gate 16, thus avoiding exposure of the gate material.

Figure 11:
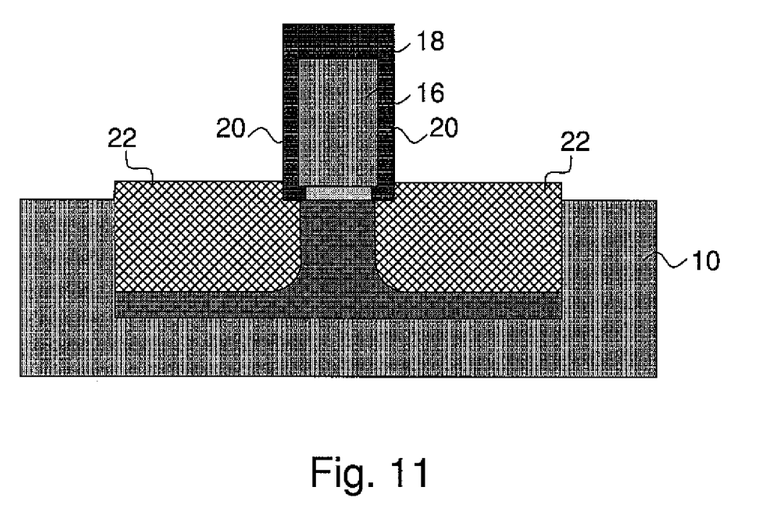

In FIG. 11, the source and drain wells 21 are filled with material 22, similar to that described with reference to FIG. 5. Here, again, the material can be any material suitable for achieving the desired device performance. Also, further process steps to implement the invention.

Still referring to FIG. 11, the processes described herein and more particularly the use of the isotropic etching process in combination with the protective layer 20, results in the gate and the source and drain regions approaching extreme proximity. More specifically, the source and drain regions are formed under the gate 16, beyond at least a portion or outer edge of the undercut. Thus, using the methods described herein produces devices with improved performance, while preventing any shorting from occurring.

Figure 12:
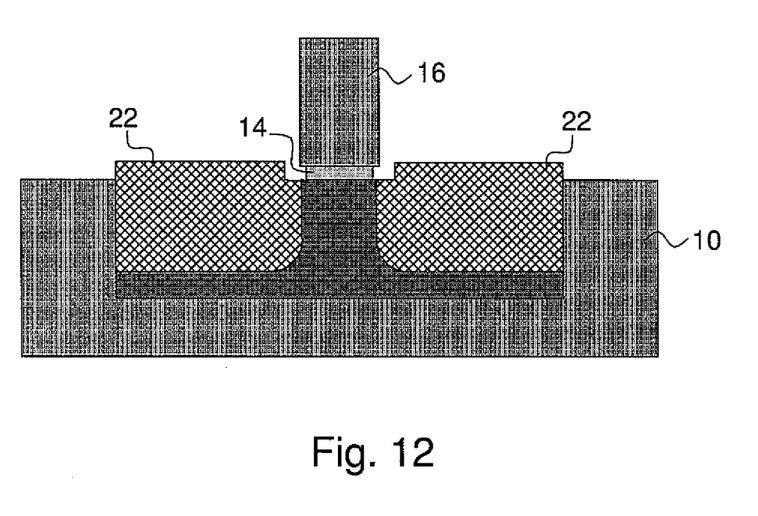
FIG. 12 shows a final processing step in accordance with the invention, in addition to a final structure.

FIG. 12 shows the device after the removal of the protective material 20. As described with reference to FIG. 6, the gap can further be filled with material to improve device performance, such as gate oxide.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A structure, comprising:
  a gate oxide layer formed on a substrate;
  a gate formed on the gate oxide layer;
  at least one material about walls and a top surface of the gate and further formed within an undercut underneath the gate such that the at least one material completely encloses the gate and the gate oxide layer to protect regions of the gate oxide layer exposed by the undercut; and
  source and drain regions isolated from both the gate and the gate oxide layer by the at least one material about walls of the gate,
  wherein a single material of the at least one material completely fills the undercut.

2. The device according to claim 1, wherein the gate oxide layer comprises high dielectric constant (high-k) material.

3. The device according to claim 1, wherein the source and drain regions comprise epitaxially grown silicon germanium material.

4. The device according to claim 1, wherein the gate oxide layer has a thickness from about 0.5 nm to about 3 nm.

5. The device according to claim 1, wherein the at least one material is a protective barrier layer of silicon nitride forming sidewalls and a gate cap.

6. The device according to claim 1, wherein the at least one material has a thickness of less than 10 nm about the walls of the gate.

7. The device according to claim 1, wherein the device is a PFET device.

8. The device according to claim 1, wherein the source and drain regions are formed under the gate, beyond at least a portion of the undercut.

9. The device according to claim 1, wherein the undercut is formed in the gate oxide layer.

10. The device of claim 1, wherein the at least one material is the single material that completely fills the undercut.

11. The device according to claim 1, wherein the at least one material is a protective barrier layer of silicon nitride forming sidewalls and a gate cap and the at least one material completely fills the undercut.

* * * * *